(12) United States Patent
Kim et al.

(10) Patent No.: US 8,201,324 B2
(45) Date of Patent: Jun. 19, 2012

(54) METHOD OF MANUFACTURING ELECTRONIC COMPONENT EMBEDDED CIRCUIT BOARD

(75) Inventors: Byoung-Chan Kim, Cheongju-si (KR);
Young-Hwan Shin, Daejeon (KR);
Jong-Jin Lee, Daejeon (KR)

(73) Assignee: Samsung Electro-Mechanics Co., Ltd., Gyunggi-Do (KR)

(*) Notice: Subject to any disclaimer, the term of this patent is extended or adjusted under 35 U.S.C. 154(b) by 585 days.

(21) Appl. No.: 12/359,416

(22) Filed: Jan. 26, 2009

(65) Prior Publication Data
US 2010/0012364 A1 Jan. 21, 2010

(30) Foreign Application Priority Data
Jul. 21, 2008 (KR) .................. 10-2008-0070662

(51) Int. Cl.
*H05K 3/36* (2006.01)
(52) U.S. Cl. ............ 29/830; 29/825; 29/832; 29/834; 29/846; 29/852
(58) Field of Classification Search .......... 29/825, 29/830, 832, 834, 852; 257/686
See application file for complete search history.

(56) References Cited

U.S. PATENT DOCUMENTS
6,784,530 B2 * 8/2004 Sugaya et al. ............ 257/686
6,897,096 B2 * 5/2005 Cobbley et al. ............ 438/123
7,018,866 B2 * 3/2006 Sugaya et al. ............ 438/108
7,169,652 B2 * 1/2007 Kimura .................... 438/149
7,351,608 B1 * 4/2008 Mountain ................ 438/106
2008/0098597 A1 5/2008 Jung et al.

FOREIGN PATENT DOCUMENTS
| JP | 2007-081423 | 3/2007 |
| KR | 10-0704911 B1 | 4/2007 |
| KR | 10-0733251 | 6/2007 |
| KR | 10-0816324 | 3/2008 |
| TW | 282160 | 6/2007 |

OTHER PUBLICATIONS

Korean Office Action issued in Korean Patent Application No. KR 10-2008-0070662 dated May 19, 2010.
Taiwan Office Action, along with partial English translation, issued in Taiwan Patent Application No. 98106009 dated Nov. 4, 2011.

* cited by examiner

*Primary Examiner* — Carl Arbes
(74) *Attorney, Agent, or Firm* — McDermott Will & Emery LLP

(57) ABSTRACT

An electronic component embedded printed circuit board and a method for manufacturing the same are disclosed. The method includes: providing a first carrier having a first circuit pattern formed on one surface thereof; providing a second carrier having a second circuit pattern formed on one surface thereof; flip-chip bonding an electronic component to the first circuit pattern; stacking one side of an insulator on one side of the first carrier to cover the electronic component; compressing the second carrier having the second circuit pattern formed on one surface thereof on an other side of the insulator; and removing the first carrier and the second carrier. The method can improve the degree of conformation for an electrical component by embedding the electrical component using a flip-chip bonding method and can improve the yield by simplifying the production process.

6 Claims, 39 Drawing Sheets

METHOD OF MANUFACTURING ELECTRONIC COMPONENT EMBEDDED CIRCUIT BOARD

CROSS-REFERENCE TO RELATED APPLICATIONS

This application claims the benefit of Korean Patent Application No. 10-2008-0070662 filed with the Korean Intellectual Property Office on Jul. 21, 2008, the disclosure of which is incorporated herein by reference in its entirety.

BACKGROUND

1. Technical Field

The present invention relates to a method of manufacturing an electronic component embedded printed circuit board.

2. Description of the Related Art

In step with the trends towards smaller size and higher density in a current electronic component, there has been an evolution of technology for advance in a package that connects the electronic component with a printed circuit board, and for providing a pattern having ultra-fine pitch, which are being produced in smaller and smaller sizes. In particular, in a case of wire bonding, which is a traditional method of connecting, an active research is now being devoted to apply the method on a bonding pad that is between 40 μm and 50 μm in pitch.

In step with the trends towards a smaller size in pitch for an electronic component embedded board, when forming a via using a laser drill, there are demands for establishing registration between layers and for narrowing a insulation distance in order to minimize the size of a via for interconnection, to reduce the thickness of an insulation layer.

FIG. 1 is a cross-sectional view of an electronic component embedded printed circuit board according to the related art. Illustrated in FIG. 1 are a core 1, an electronic component 2, an electrode 3, a via 4, 5, insulators 6a and 6b, and a circuit pattern 7.

As illustrated in FIG. 1, an electronic component embedded printed circuit board according to the related art includes a core 1, which embeds an electronic component 2 therein, and the electronic component 2 is connected with a circuit pattern 7 through a via 4, which is placed on the electronic component 2 and the core 1. Below, a method of manufacturing an electronic component embedded printed circuit board in accordance with the related art will be described with reference to FIGS. 2 to 7.

FIGS. 2 to 7 are flow diagrams illustrating a method of manufacturing an electronic component embedded printed circuit board according to the related art. Illustrated in FIGS. 2 to 7 are a core 1, a cavity 1a, an electronic component 2, an electrode 3, a via 4, 5, insulators 6a and 6b, a circuit pattern 7, a solder ball 8 and an adhesive tape 9.

As illustrated in FIG. 2, after forming a cavity 1a, which is for embedding an electronic component 2, by processing a core 1 having a via 5 formed thereon, an adhesive tape 9 is attached at the bottom of the core 1 for fixing the electronic component 2 in accordance with the related art.

After that, the electronic component 2 may be landed in the cavity 1a, which is illustrated in FIG. 3, and then an insulator 6a may be stacked on the top side of the core 1, which is shown in FIG. 4.

Then, as illustrated in FIG. 5, the adhesive tape 9 may be removed, and then an insulator 6b may be stacked at the bottom of the core 1, which is illustrated in FIG. 6.

After that, a via 4 may formed, and then several circuit patterns 7 can be formed as illustrated in FIG. 7.

According to the related art, however, there may be a problem of defective interconnection when forming the via 4 for connecting the electronic component 2 with the circuit patterns 7. In addition, an electrode 3 of the electronic component 2 may be damaged by a layer drill during the process.

Furthermore, the adhesive tape 9 may not be completely removed, and thus the product reliability and yield ratio may be declined.

SUMMARY

An aspect of the invention provides a method of manufacturing a printed circuit board, in which an electronic component may be embedded for improving the degree of conformation and improving the yield by simplifying the production process Another aspect of the invention provides an electronic component embedded printed circuit board, which includes: an insulator; a first circuit pattern buried in one side of the insulator; an electronic component embedded in the insulator and flip-chip bonded with the first circuit pattern; and a second circuit pattern buried in an other side of the insulator.

Here, the electronic component can be flip-chip bonded with the first circuit pattern using a solder bump or a gold stud bump.

Yet, another aspect of the invention provides a method of manufacturing an electronic component embedded printed circuit board. The method includes: providing a first carrier having a first circuit pattern formed on one surface thereof; providing a second carrier having a second circuit pattern formed on one surface thereof; flip-chip bonding an electronic component to the first circuit pattern; stacking one side of an insulator on one side of the first carrier to cover the electronic component; compressing the second carrier having the second circuit pattern formed on one surface thereof on an other side of the insulator; and removing the first carrier and the second carrier.

Here, the electronic component can be flip-chip bonded with the first circuit pattern using a solder bump or a gold stud bump.

In addition, the providing of the first carrier having the first circuit pattern formed on one surface thereof and the providing of the second carrier having the second circuit pattern formed on one surface thereof can be performed simultaneously through: providing the first carrier and the second carrier coupled together with an adhesive layer; forming the first circuit pattern on the first carrier and the second circuit pattern on the second carrier through electroplating; and separating the first carrier and the second carrier.

Additionally, a first seed layer can be formed on one side of the first carrier, in which the first seed layer is made of a different material from that of the first carrier, and the removing of the first carrier can include removing the first seed layer.

Still, another aspect of the invention provides an electronic component embedded printed circuit board, which includes: an insulator; a first circuit pattern buried in one side of the insulator; a first electronic component embedded in the insulator and flip-chip bonded with the first circuit pattern; a second circuit pattern buried in an other side of the insulator; and a second electronic component embedded in the insulator and connected with the second circuit pattern.

Here, the first electronic component can be flip-chip bonded with the first circuit pattern using a solder bump or a gold stud bump.

In addition, an adhesive part interposed between the first electronic component and the second electronic component can be made of a different material from that of the insulator.

Still, another aspect of the invention further provides a method of manufacturing an electronic component embedded printed circuit board. The method can include: providing a first carrier having a first circuit pattern formed on one surface thereof; flip-chip bonding a first electronic component to the first circuit pattern; stacking a first insulator on one side of the first carrier to cover the first electronic component; providing a second carrier having a second circuit pattern formed on one surface thereof; flip-chip bonding a second electronic component to the second circuit pattern; stacking a second insulator on one side of the second carrier to cover the second electronic component; compressing the first insulator and the second insulator such that the first electronic component and the second electronic component face each other; and removing the first carrier and the second carrier.

Here, the first electronic component can be flip-chip bonded with the first circuit pattern using a solder bump or a gold stud bump.

In addition, the providing of the first carrier having the first circuit pattern formed on one surface thereof and the providing of the second carrier having the second circuit pattern formed on one surface thereof can be performed simultaneously through: providing the first carrier and the second carrier coupled together with an adhesive layer; forming the first circuit pattern on the first carrier and the second circuit pattern on the second carrier through electroplating; and separating the first carrier and the second carrier.

Additionally, a first seed layer can be formed on one side of the first carrier, in which the first seed layer is made of a different material from that of the first carrier, and the removing of the first carrier can include removing the first seed layer.

Still, another aspect of the invention further provides a method of manufacturing an electronic component embedded printed circuit board. The method can include: providing a first carrier having a first circuit pattern formed on one surface thereof; flip-chip bonding a first electronic component to the first circuit pattern; adhering a second electronic component to the first electronic component by using an adhesive part; stacking one side of an insulator on the first carrier to cover the first electronic component and the second electronic component; forming a via and a second circuit pattern on another side of the insulator, the via configured to be connected with the second electronic component and the second circuit pattern configured to be electrically connected with the via; and removing the first carrier.

Here, the first electronic component can be flip-chip bonded with the first circuit pattern using a solder bump or a gold stud bump.

Additionally, a first seed layer can be formed on one side of the first carrier, in which the first seed layer is made of a different material from that of the first carrier, and the removing of the first carrier can include removing the first seed layer.

Additional aspects and advantages of the present invention will be set forth in part in the description which follows, and in part will be obvious from the description, or may be learned by practice of the invention.

DETAILED DESCRIPTION

Figure 1:
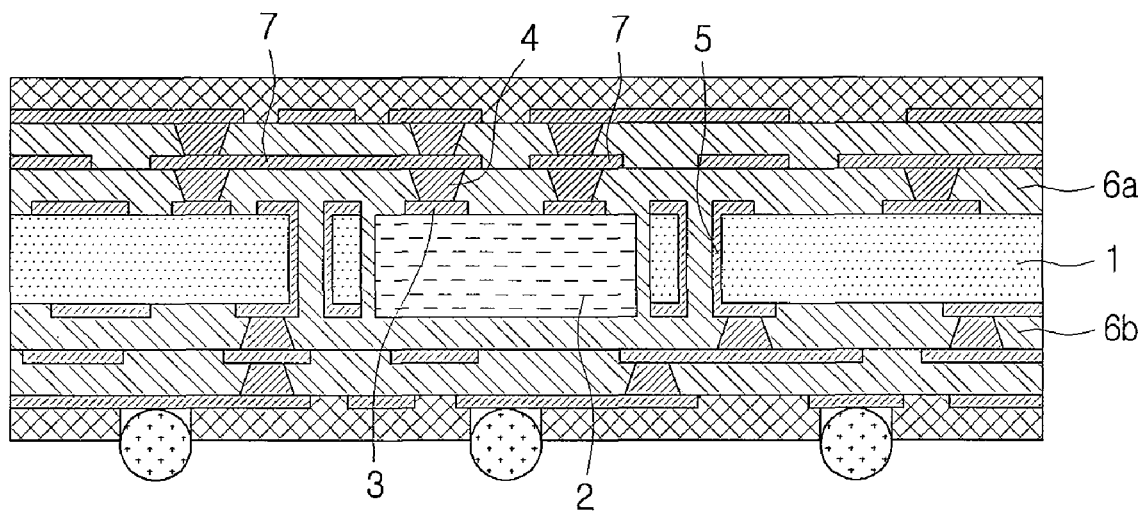
FIG. 1 is a cross sectional view illustrating an electronic component embedded printed circuit board according to the related art.
Figure 2:
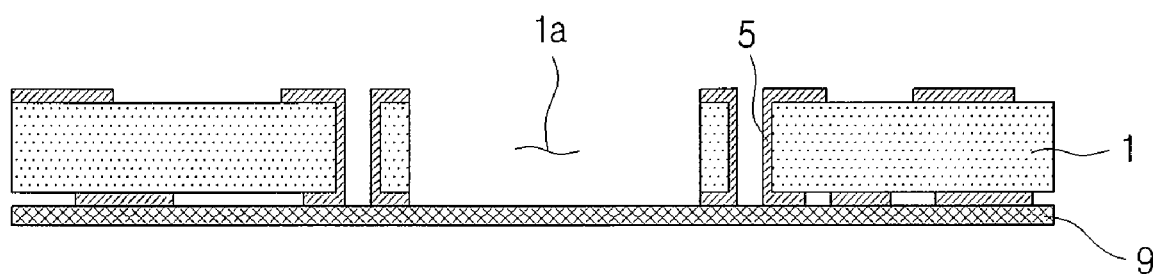
FIGS. 2 to 7 are flow diagrams illustrating a method of manufacturing an electronic component embedded printed circuit board according to the related art.
Figure 3:
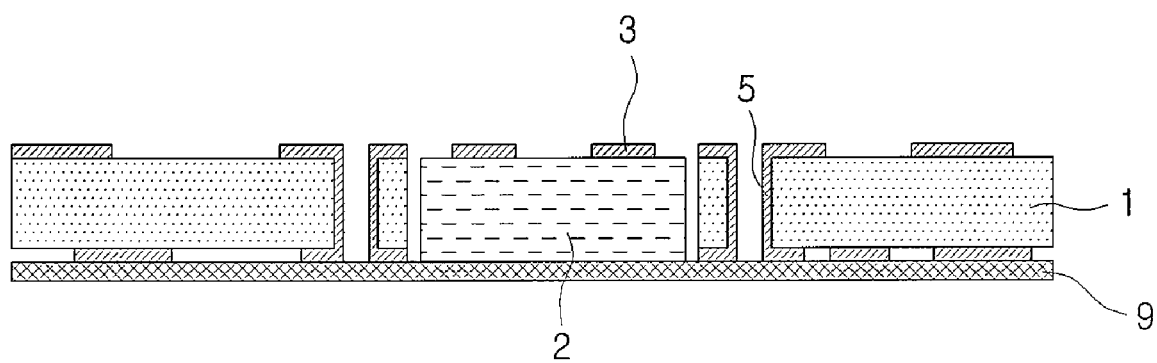
Figure 4:
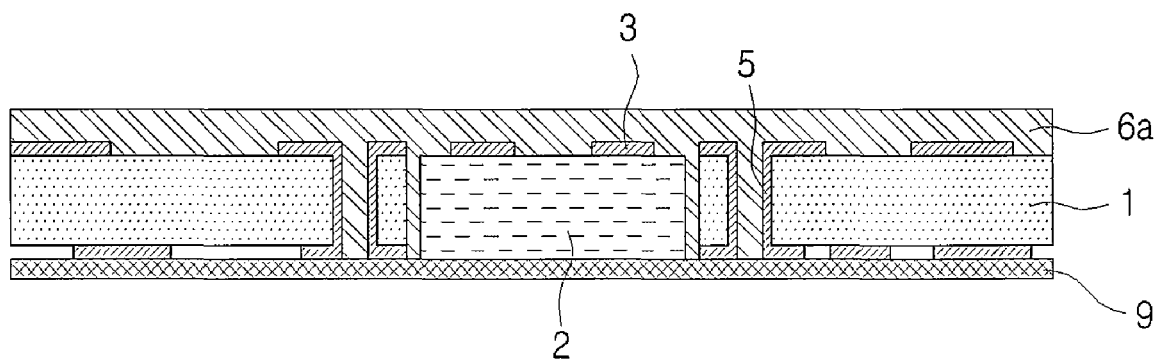
Figure 5:
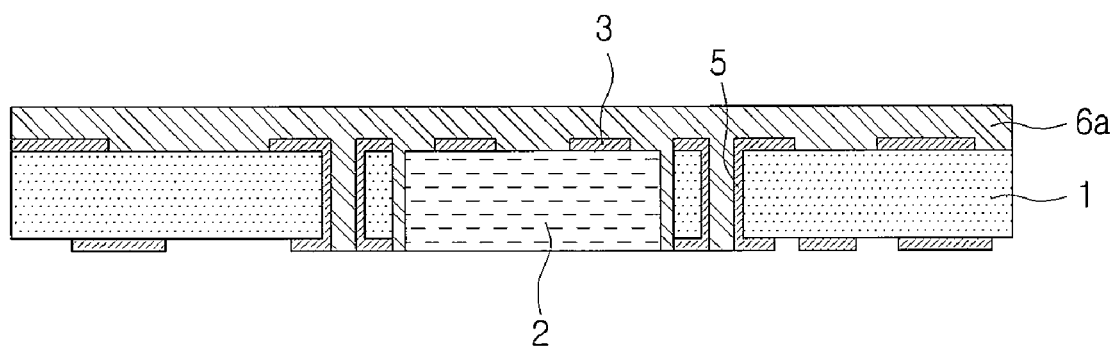
Figure 6:
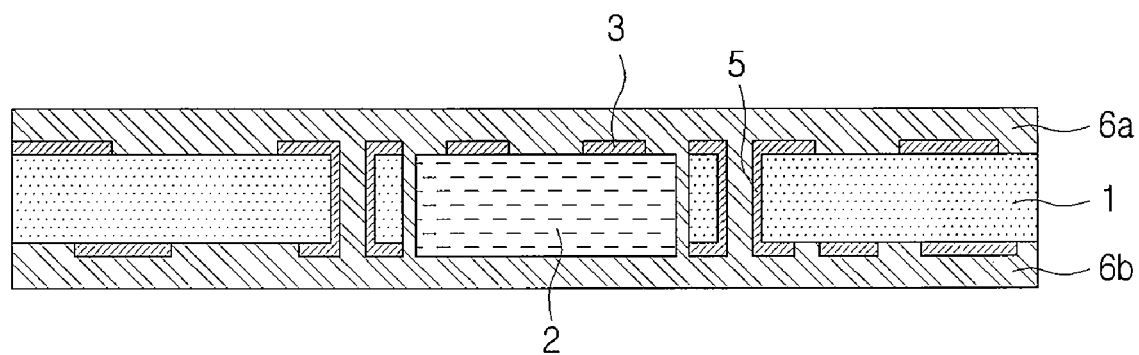

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another. For example, a first component may be referred to as a second component without departing from the scope of rights of the present invention, and likewise a second component may be referred to as a first component. The term "and/or" encompasses both combinations of the plurality of related items disclosed and any item from among the plurality of related items disclosed.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The method of manufacturing an electronic component embedded printed circuit board according to embodiments of the invention will be described below in more detail with reference to the accompanying drawings. Those components that are the same or are in correspondence are rendered the same reference numeral regardless of the figure number, and redundant explanations are omitted.

FIGS. 8 to 11 are cross-sectional views illustrating embodiments of an electronic component embedded printed circuit board according to an aspect of the present invention. Illustrated in FIGS. 8 to 11 are circuit patterns 15a, 15b and 15c, a via 16, an electronic component 20, a solder bump 21, a stud bump 22, insulators 30 and 36, an underfill part 32 and a solder resist 34.

Figure 7:
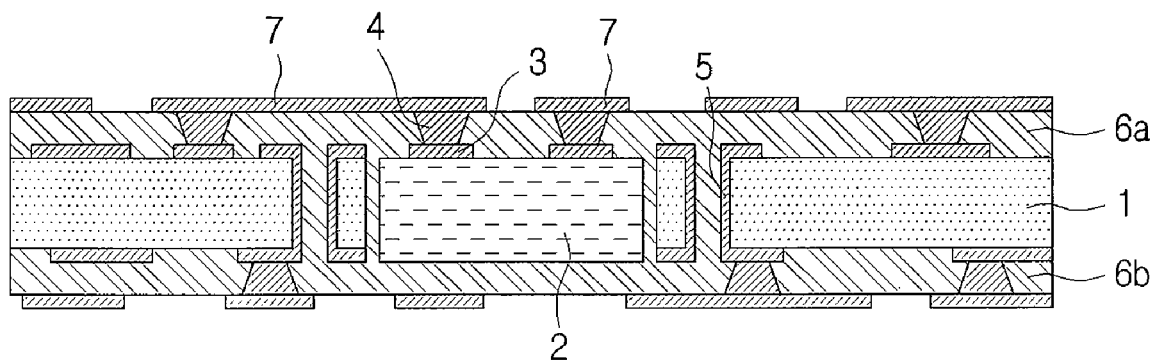
Figure 8:
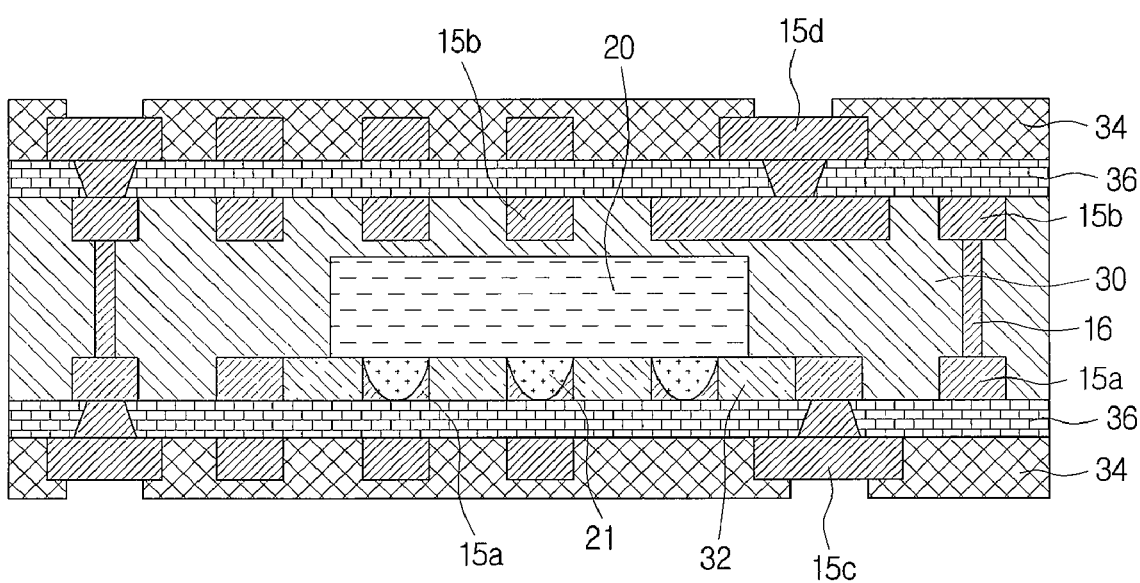
FIGS. 8 to 11 are cross-sectional views illustrating embodiments of an electronic component embedded printed circuit board according to an aspect of the present invention.

As illustrated in FIG. 8, an electronic component embedded printed circuit board in accordance with the present embodiment includes an insulator 30, which embeds a first circuit pattern 15a, a second circuit pattern 15b and an electronic component 20, and the electronic component 20 can be flip-chip bonded with the first circuit pattern 15a. In other words, an electronic component embedded printed circuit board according to the present embodiment presents that the electronic component 20 can be simply flip-chip bonded with the circuit pattern 15a embedded in the insulator 30, without processing a via 4 (FIG. 7) for connecting to the electronic component 20. Through such a method, the problem of defective interconnection due to degraded adhesion when processing a via can be solved.

Figure 9:
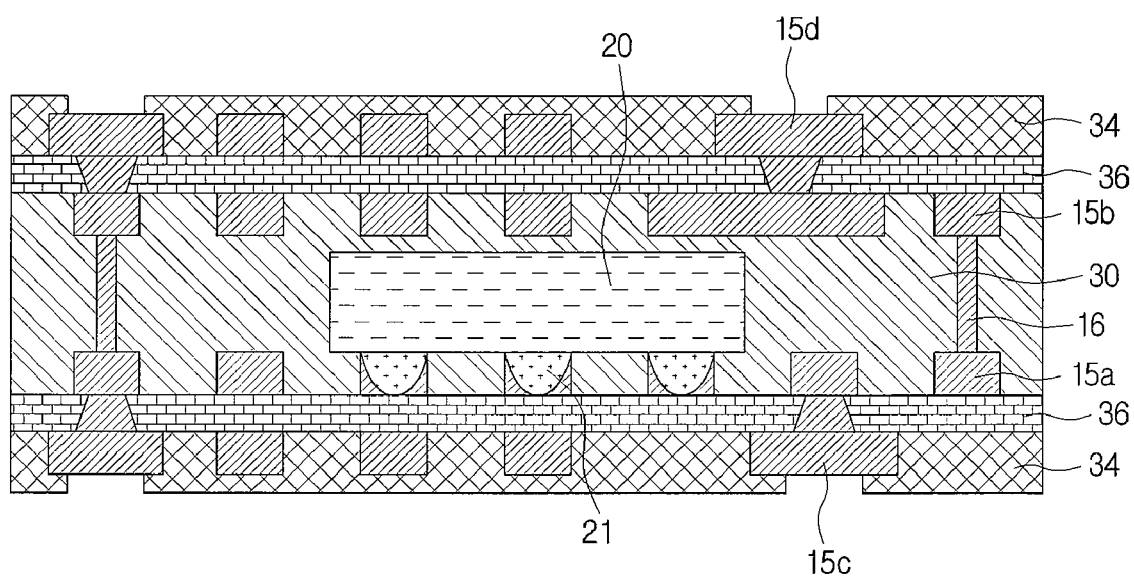
Figure 10:
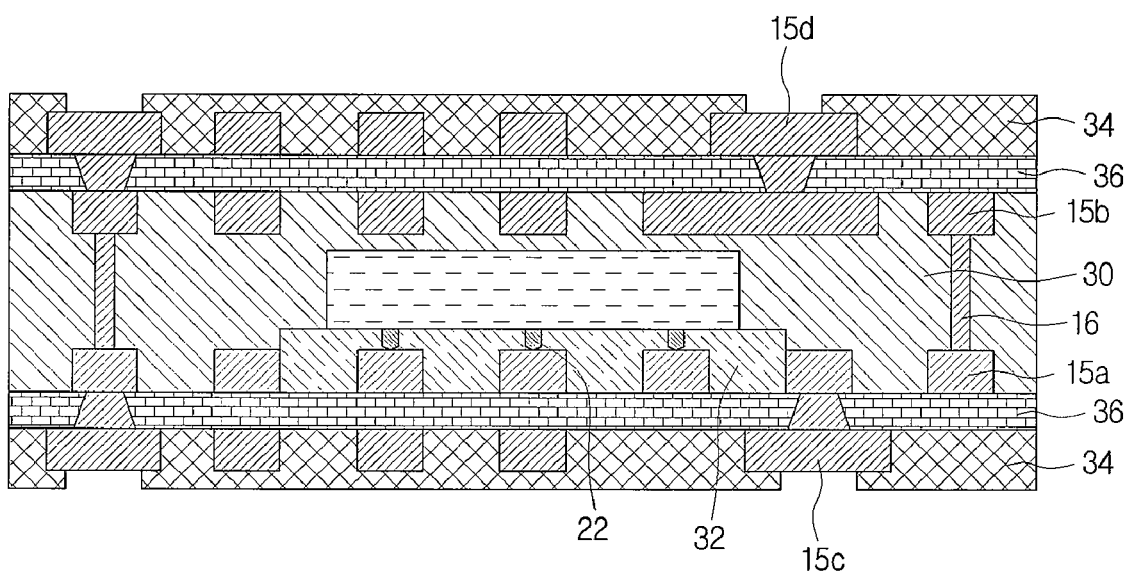
Figure 11:
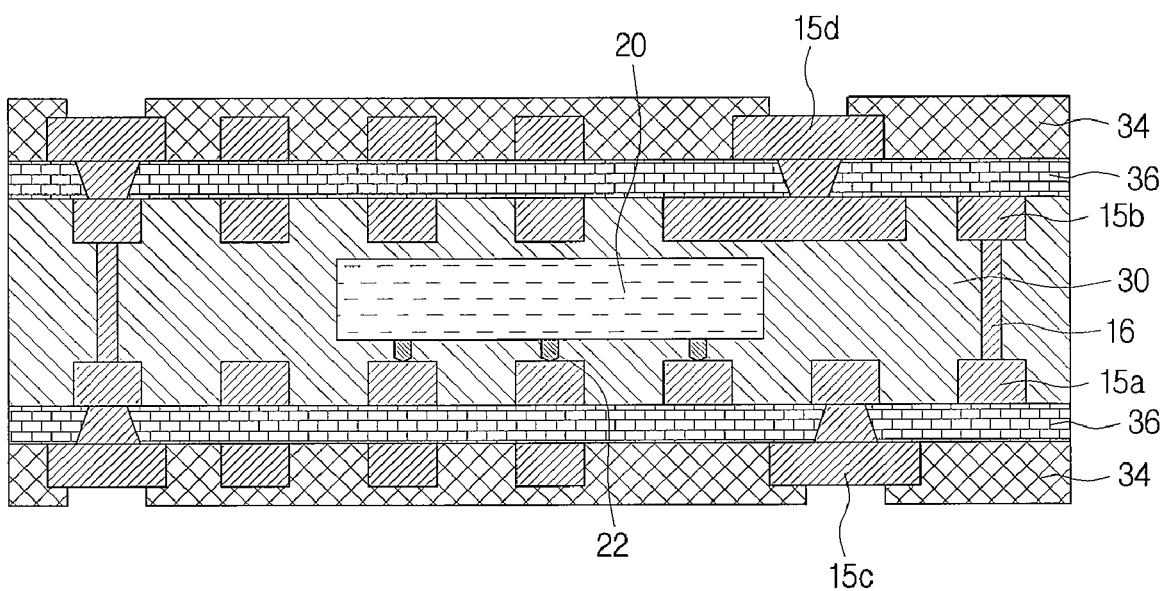

As such, several methods of implementing the flip-chip bonding structure are disclosed below. In FIGS. 8 and 9, a structure using a solder bump 21 is presented. In FIGS. 10 and 11, a structure using a gold stud bump 22 is presented. It is appreciated that the flip-chip bonding structure can be also implemented through various materials and structures.

Meanwhile, a via 16, which penetrates through the insulator 30, can be formed for electrically connecting the first circuit pattern 15a to the second circuit pattern 15b. For forming the via 16, a hole (not illustrated) can be formed in the insulation layer 30 by using a layer drill or a mechanical drill, and then a conductive material can be filled inside the penetrated hole by way of plating.

In addition, as illustrated in FIG. 8, when implementing a multi-layered structure, an additional insulator 36 can be respectively stacked on each side of the insulator 30, and then each of circuit patterns 15c and 15d can be formed on each insulator 36.

A solder resist 34 can be formed at an outermost layer for protecting the circuit patterns 15c and 15d, and an aperture can be formed in some portions for connecting to an outside device.

Meanwhile, an underfill part 32 can be formed at the bottom of the electronic component 20. As illustrated in FIGS. 8 and 10, the underfill part 32 can be made of a material that is different from the insulator 30 covering the electronic component 20. As illustrated in FIGS. 9 and 11, the underfill part 32 can be made of a material that is the same as the insulator 30.

Until now, the structure of an electronic component embedded printed circuit board according to an aspect of the present invention has been described. Below, a method of manufacturing an electronic component embedded printed circuit board having the same structure will be described.

Figure 12:
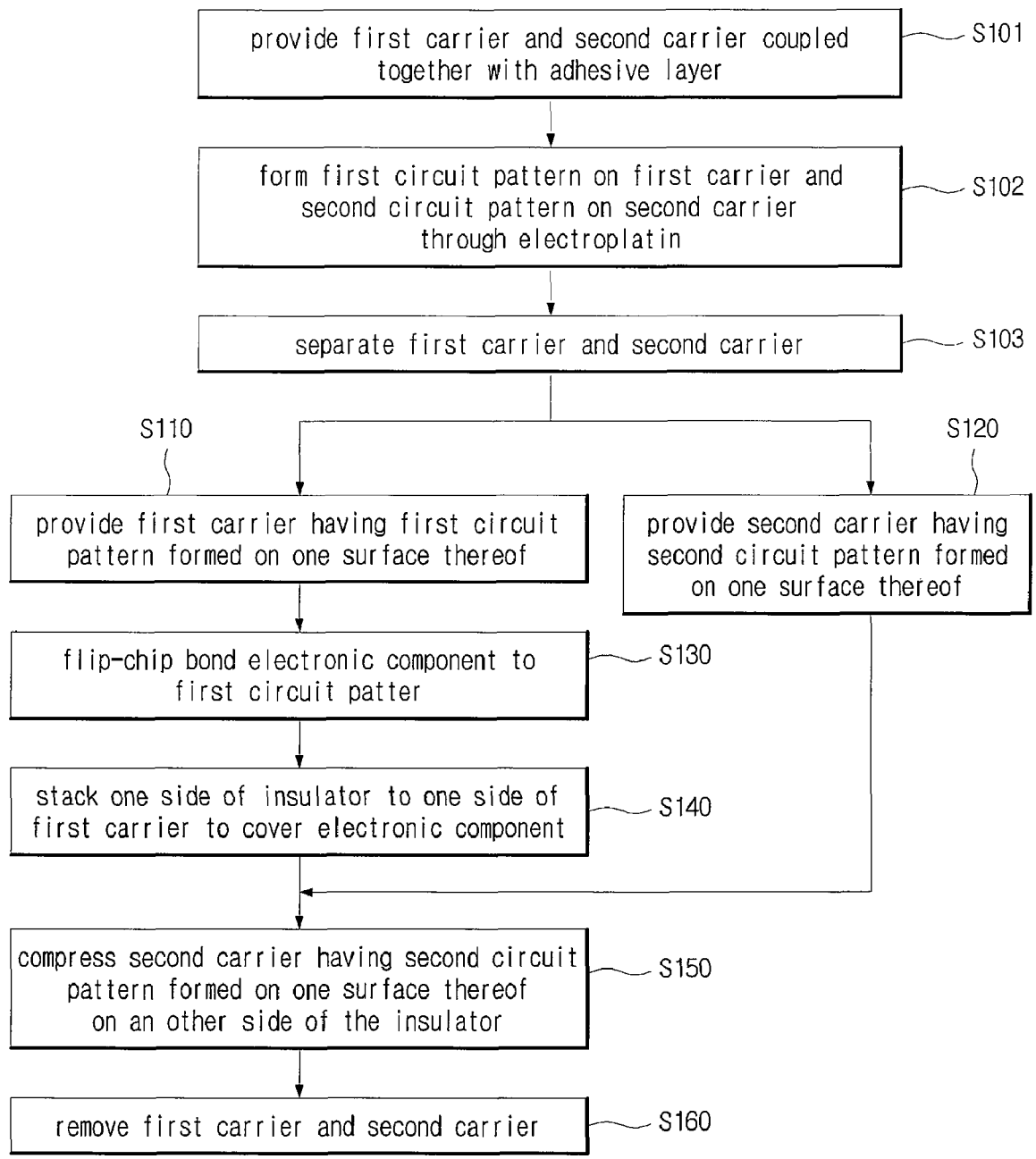
FIG. 12 is a flowchart illustrating a method of manufacturing an electronic component embedded printed circuit board shown in FIGS. 8 to 11.

FIG. 12 is a flowchart illustrating a method of manufacturing an electronic component embedded printed circuit board shown in FIGS. 8 to 11. FIGS. 13 to 25 are flow diagrams illustrating a method of manufacturing an electronic component embedded printed circuit board shown in FIG. 12. Illustrated in FIGS. 13 to 25 are a adhesive film 11, a first carrier 12a, a second carrier 12b, a first seed layer 13a, a second seed layer 13b, plating resists 14a and 14b, circuit patterns 15a, 15b, 15c and 15d, a via 16, an electronic component 20, a solder bump 21, a stud bump 22, insulators 30 and 36, an underfill part 32 and a solder resist 34. First of all, a first carrier 12a having a first circuit pattern 15a formed on a surface thereof and a second carrier 12b having a second circuit pattern 15b formed on a surface thereof are prepared (S110, S120). The first carrier 12a and the second carrier 12b, in which the first circuit pattern 15a is formed on a surface of the first carrier 12a and the second circuit pattern 15b is formed on a surface of the second carrier 12b, can be prepared individually or collectively.

Figure 13:
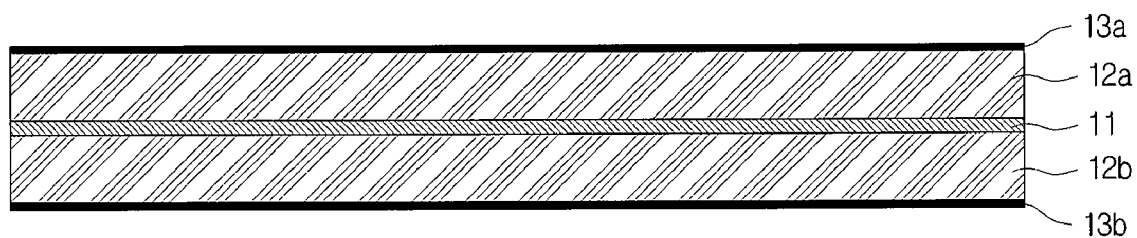
FIGS. 13 to 25 are flow diagrams illustrating a method of manufacturing an electronic component embedded printed circuit board shown in FIG. 12.
Figure 14:
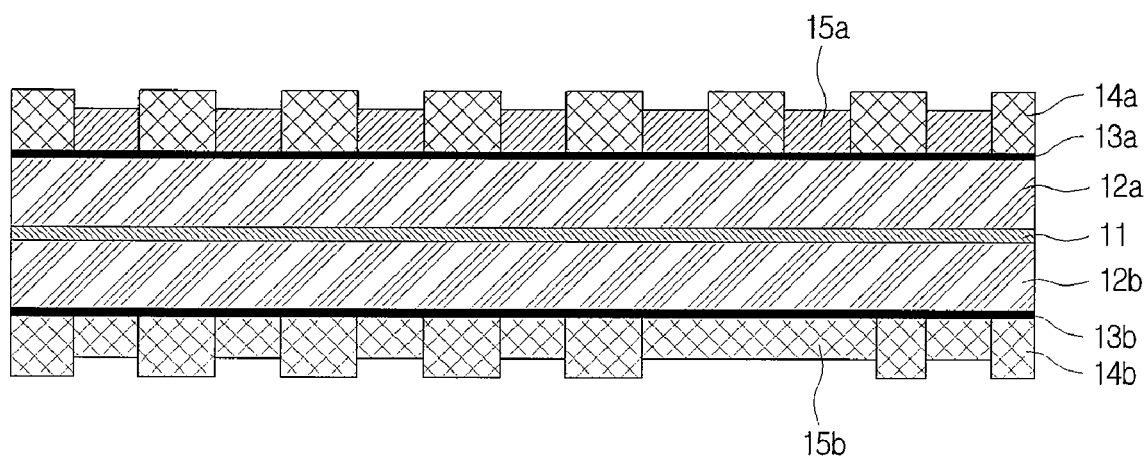

In other words, as illustrated in FIG. 13, the first carrier 12a and the second carrier 12b, which are coupled together with an adhesive layer 11, are prepared (S101). As illustrated in FIG. 14, the first circuit pattern 15a can be formed on the first carrier 12a, and the second circuit pattern 15b can be formed on the second carrier 12b by way of electroplating (S102), and then the first carrier 12a and the second carrier 12b can be separated from each other (S103).

Although an adhesive film can be used as the carriers 12a and 12b, a carrier being made of a material containing copper will be used in this embodiment. When using such a carrier, which is made of a metallic material, a chemical etching method can be used as a method of removing the carrier later.

Figure 15:
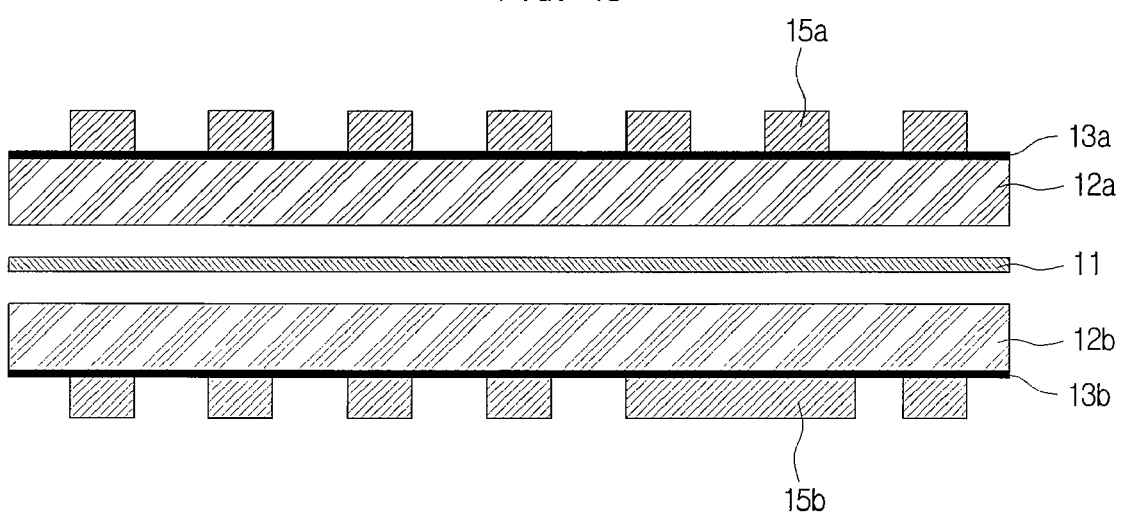

As illustrated in FIGS. 13 to 15, when using the carriers 12a and 12b, which are made of a material containing copper, seed layers 13a and 13b, which are made of a different material from that of the carriers 12a and 12b, can be formed on each surface of the carriers 12a and 12b. Then, the circuit patterns 15a and 15b can be formed on each surface of the seed layers 13a and 13b by using etching resists 14a and 14b. For example, the seed layers 13a and 13b of nickel materials can be formed. The results of using such a structure will be described later.

A material, which has a flexible adhesive strength being changed by the temperature, can be used as the adhesive layer 11 interposed between the first carrier 12a and the second carrier 12b. This is because it is good to have a low adhesive strength when separating the first carrier 12a and the second carrier 12b even though a high adhesive strength is necessary when forming a circuit pattern. Such an adhesive layer 11, for example, can be a thermoplastic adhesive layer and an effervescent adhesive layer.

Figure 16:
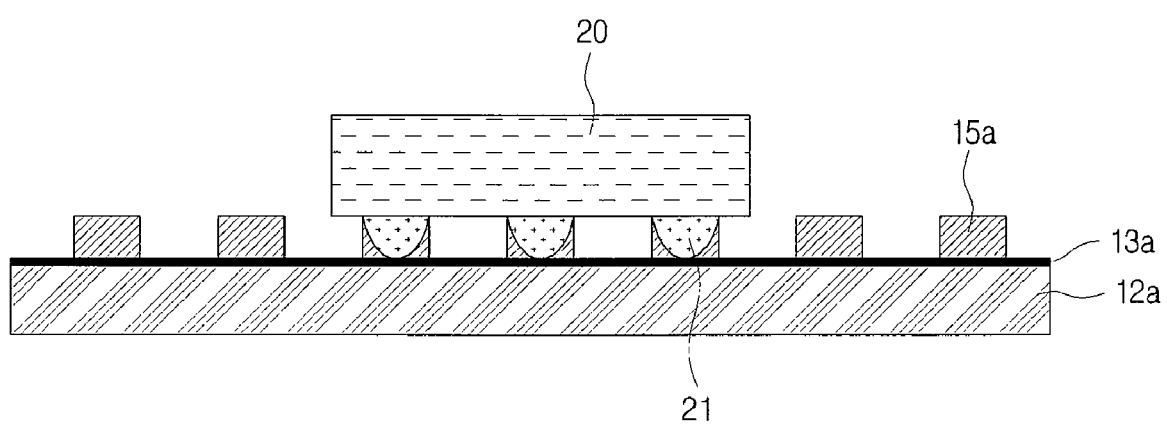
Figure 17:
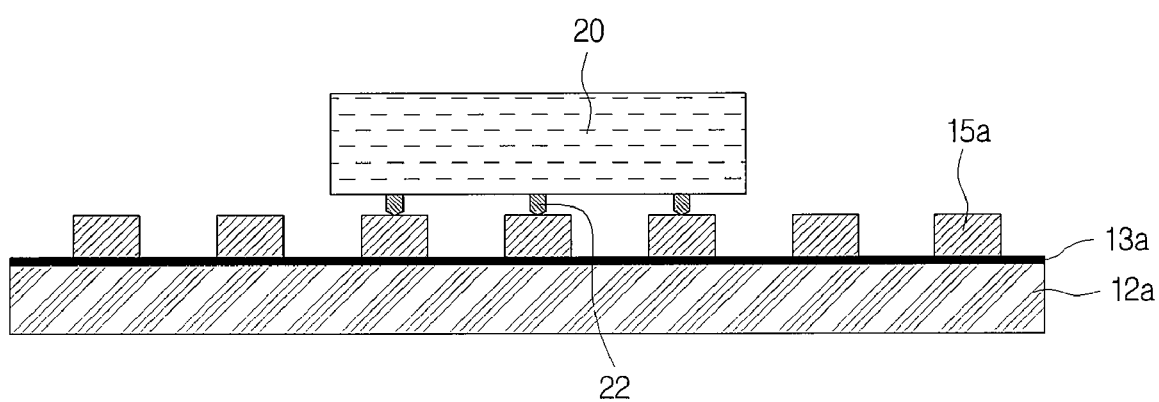

Though the method described above, the first carrier 12a having the first circuit pattern 15a formed thereon is prepared. And then, as illustrated in FIG. 16, the electronic component 20 can be flip-chip bonded with the first circuit pattern 15a (S130). Here, the electronic component 20 can be flip-chip bonded by using the solder bump, which is illustrated in FIG. 16, or by using the gold stud bump 22, which is illustrated in FIG. 17.

Figure 18:
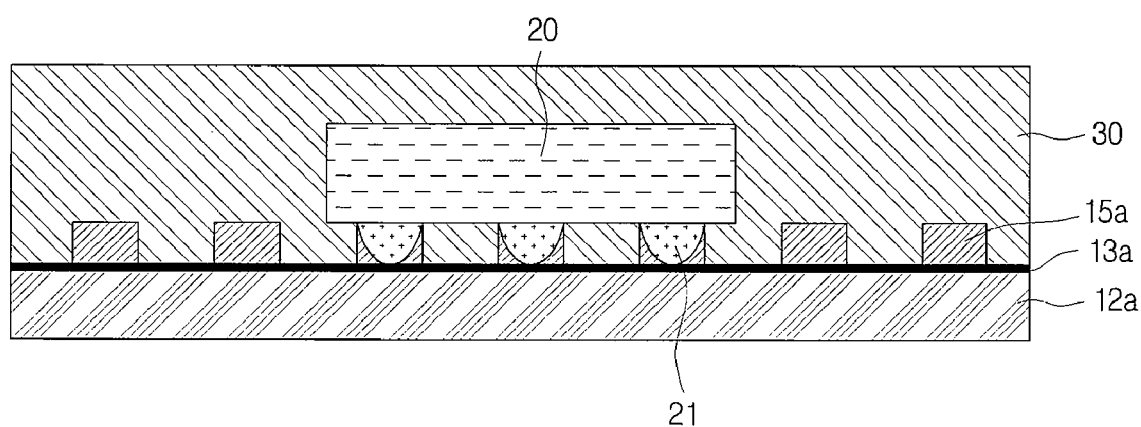
Figure 19:
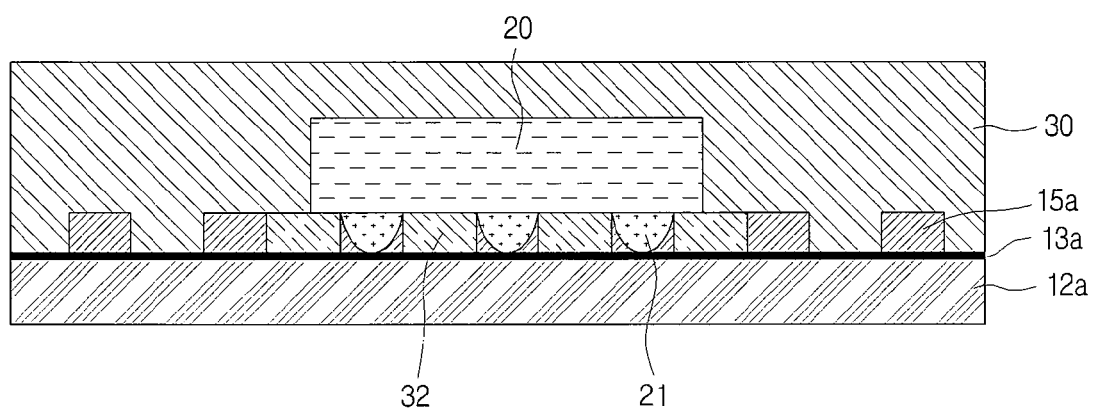

After that, as illustrated in FIG. 18, an insulator 30 can be stacked on a space of the first carrier 12a such that the electronic component 20 is completely layered (S140). If necessary, before stacking the insulator 30, an additional underfill part 32 can be formed at the bottom of the electronic component, which is illustrated in FIG. 19.

Figure 20:
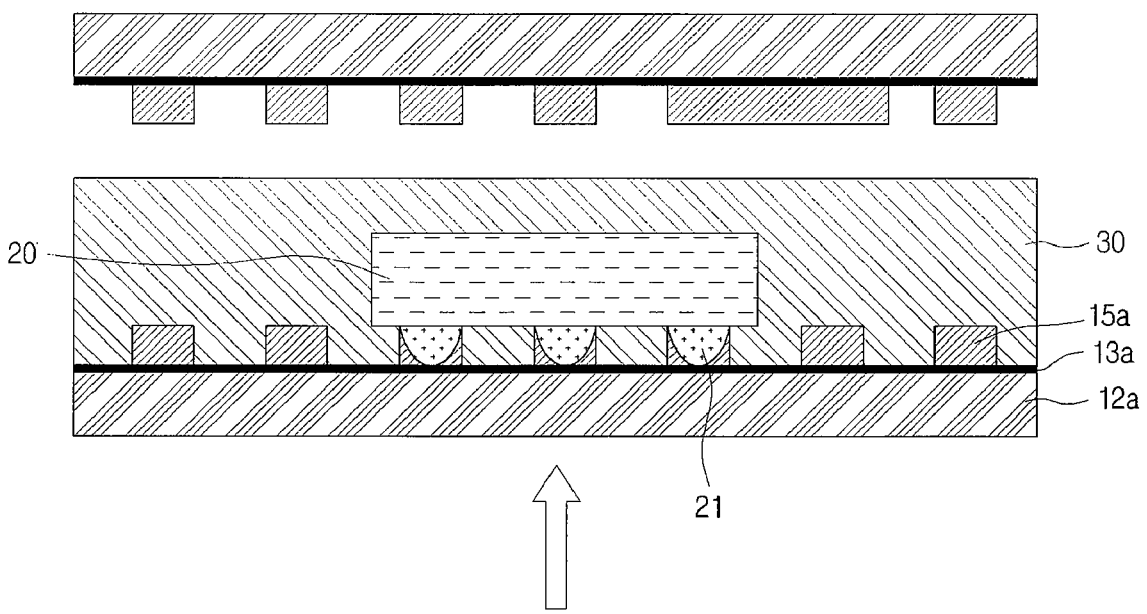
Figure 21:
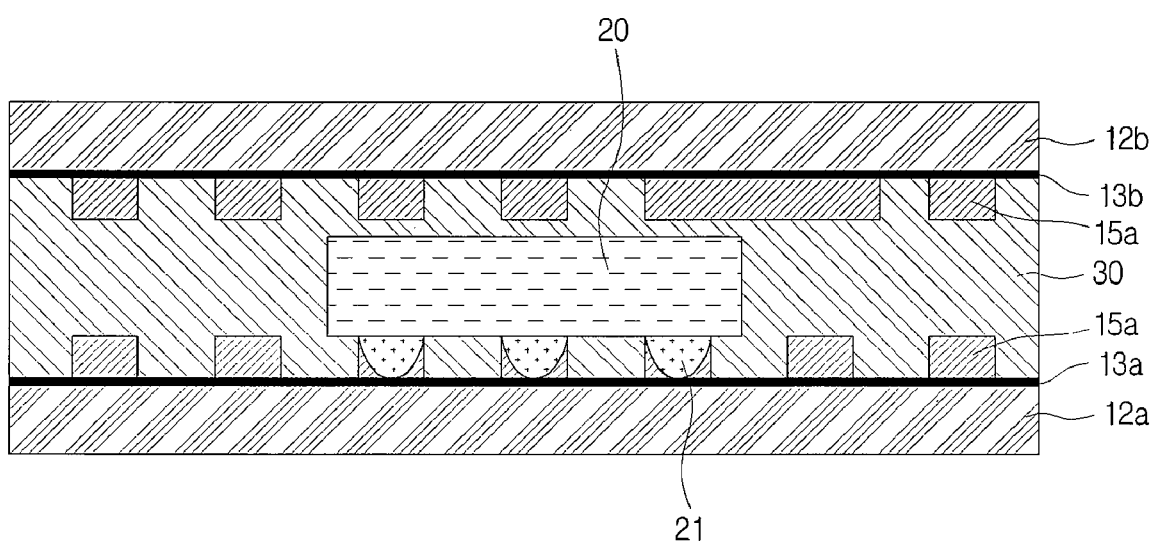

As illustrated in FIGS. 20 and 21, the second carrier 12b having the second circuit pattern 15b formed on one surface thereof can be compressed on another side of the insulator 30 (S150). Although the second carrier 12b having the second circuit pattern 15b formed on one surface thereof can be manufactured individually with the first carrier 12a having the first circuit pattern 15a formed on one surface thereof, they can be manufactured simultaneously in the same process, which has been already described above.

Figure 22:
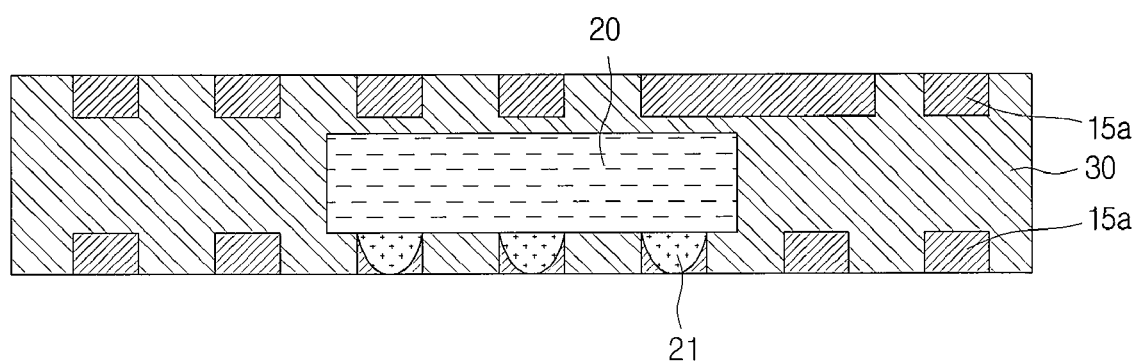

After compressing the second carrier 12b on the insulator 30 by using heat and pressure, as illustrated in FIG. 22, the first carrier 12a and the second carrier 12b can be removed (S160). Thus, the first circuit pattern 15a and the second circuit pattern 15b can be buried in the insulator 30. That is, the first circuit pattern 15a and the second circuit pattern 15b are not only embedded in the insulator 30, but also the electronic component 20 can be embedded inside the insulator 30.

Meanwhile, in order to remove the carriers 12a and 12b, the method of chemical etching can be used. In other words, by using etching liquid, the carriers 12a and 12b can be chemically removed.

As described above, when forming the seed layers 13a and 13b, which are made of a material containing nickel, on each surface of the carriers 12a and 12b, which are made of a material containing copper, the seed layers 13a and 13b can performed as a barrier layer so as to prevent the circuit patterns 15a and 15b embedded in the insulator 30 from being damaged while removing the carriers 12a and 12b by providing the etching liquid.

After etching the carriers 12a and 12b made of a material containing copper, the seed layers 13a and 13b can be also etched by using etched liquid, which only reacts with nickel. In this case, the circuit patterns 15a and 15b formed on the insulator 30 cannot react with the etching liquid, which is for removing the seed layers 13a and 13b, and thus the seed layers 13a and 13b can be completely removed without damaging the circuit patterns 15a and 15b.

Figure 23:
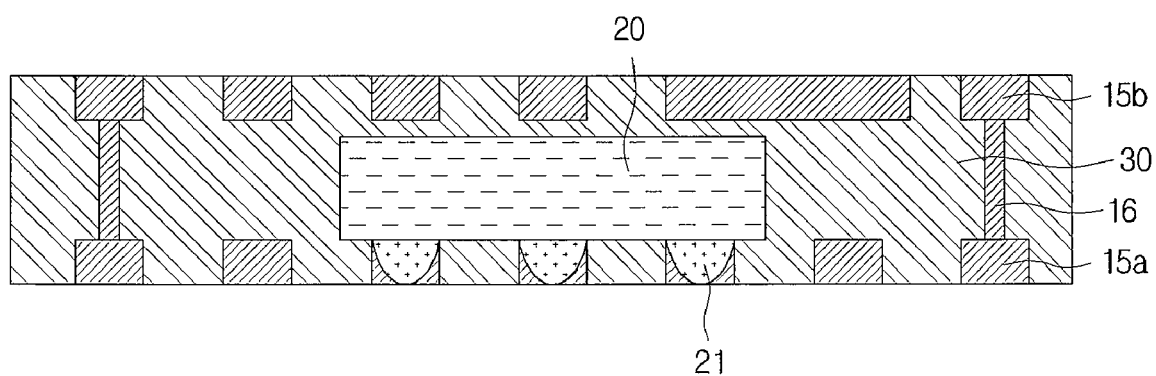
Figure 24:
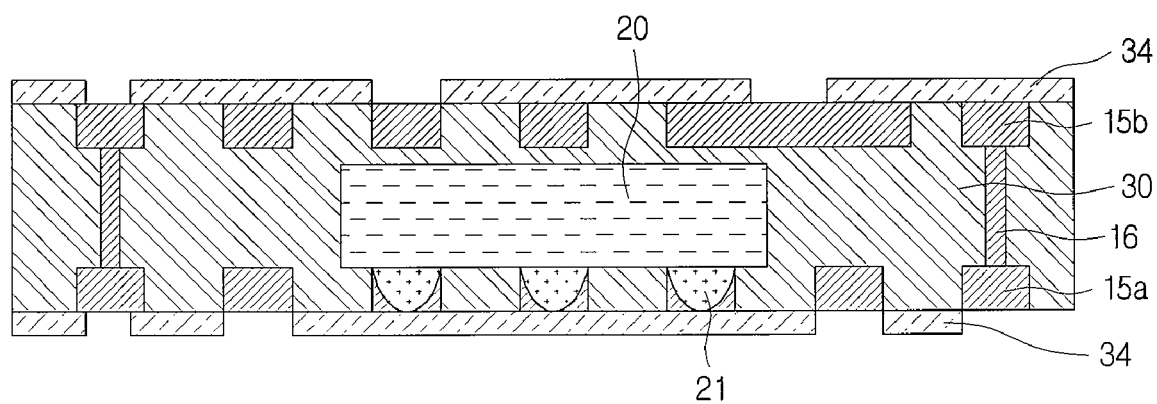

Next, as illustrated in FIG. 23, the first circuit pattern 15a and the second circuit pattern 15b can be electrically connected with the via 16, which penetrates through the insulator 30. As illustrated in FIG. 24, the circuit patterns 15a and 15b can be protected by forming a solder resist 34 at an outermost layer.

Figure 25:
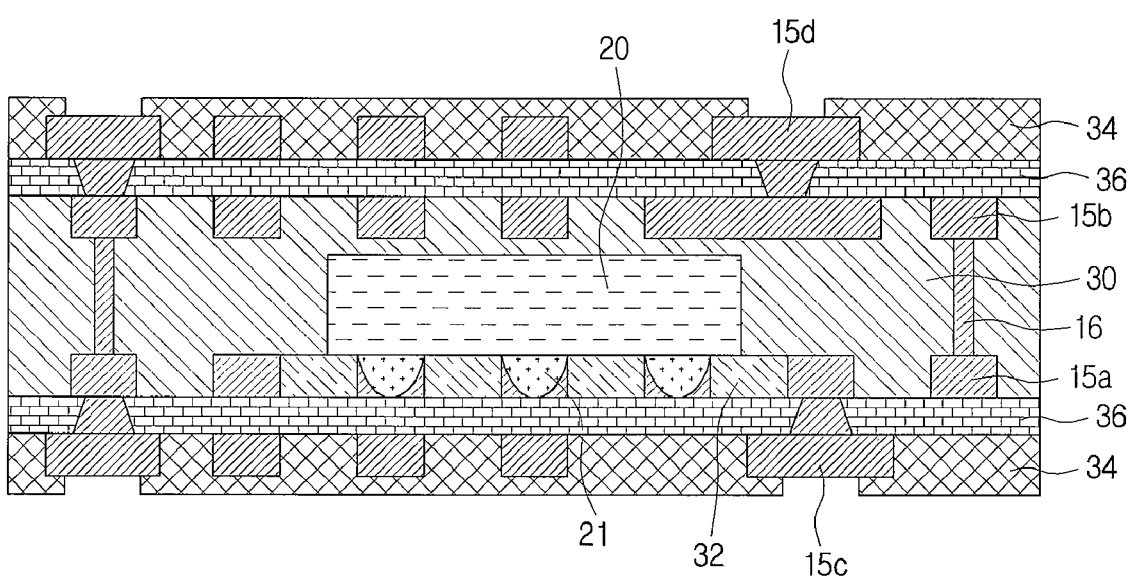

In addition, as illustrated in FIG. 25, when implementing a multi-layered structure, an additional insulator 36 can be respectively stacked on each side of the insulator 30, and then each of circuit patterns 15c and 15d can be formed on each insulator 36.

Below, a first disclosed embodiment of an electronic component embedded printed circuit board will be described in accordance with another aspect of the present invention.

Figure 26:
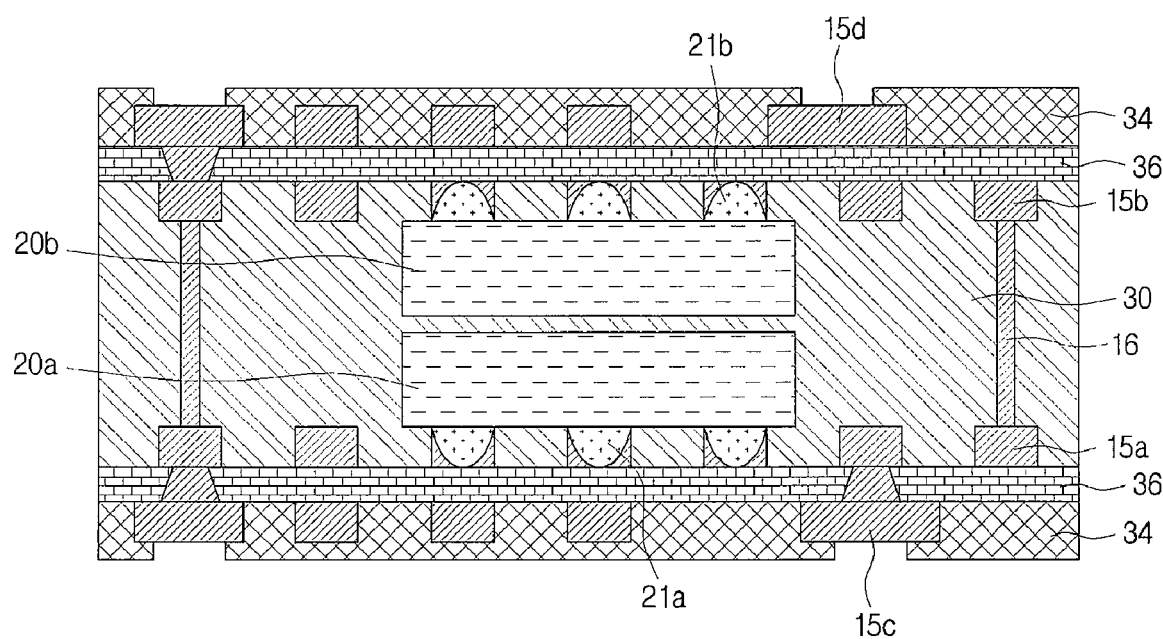
FIG. 26 is a cross sectional view illustrating a first disclosed embodiment of an electronic component embedded printed circuit board in accordance with another aspect of the present invention.

FIG. 26 is a cross sectional view illustrating a first disclosed embodiment of an electronic component embedded printed circuit board in accordance with another aspect of the present invention. Illustrated in FIG. 26 are circuit patterns 15a, 15b, 15c and 15d, a via 16, electronic components 20a and 20b, solder bumps 21a and 21b, insulators 30 and 36, and a solder resist 34. An electronic component embedded printed circuit board according to the present embodiment can have two electronic components 20a and 20b embedded in one insulator 30, in which the electronic components 20a and 20b can be respectively flip-chip bonded with circuit patterns 15a and 15b that are buried in the insulator 30. Through such a structure, an electronic component embedded circuit board having higher density can be implemented.

Except that the two electronic components 20a and 20b are embedded in one insulator 30 and they are flip-chip bonded respectively, the present embodiment has the structure of an electronic component embedded circuit board described above, so that redundant explanations are omitted.

Below, a method of manufacturing an electronic component embedded circuit board having the same structure above will be described.

Figure 27:
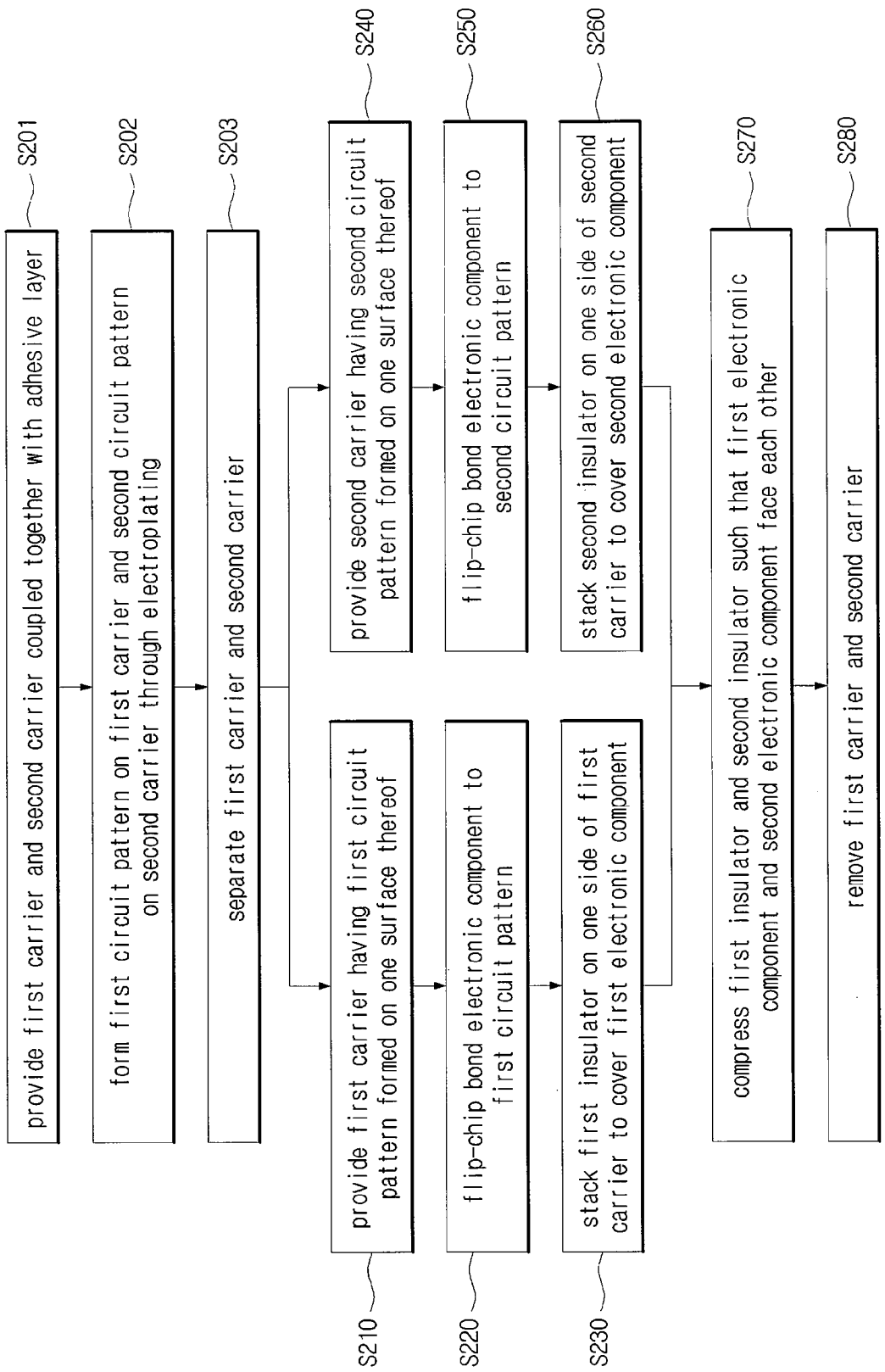
FIG. 27 is a flowchart illustrating a method of manufacturing an electronic component embedded printed circuit board shown in FIG. 26.
Figure 28:
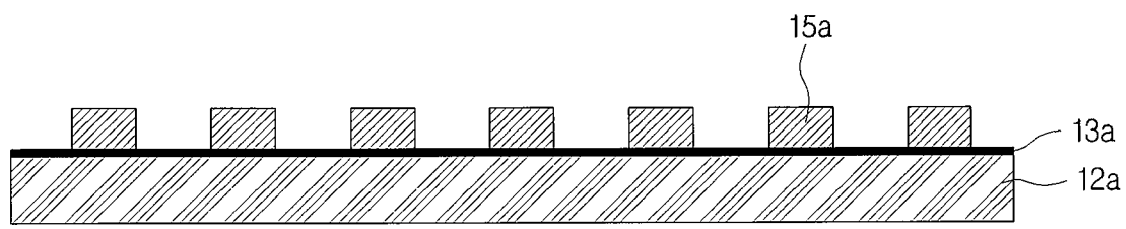
FIGS. 28 to 34 are flow diagrams illustrating a method of manufacturing an electronic component embedded printed circuit board shown in FIG. 27.
Figure 29:
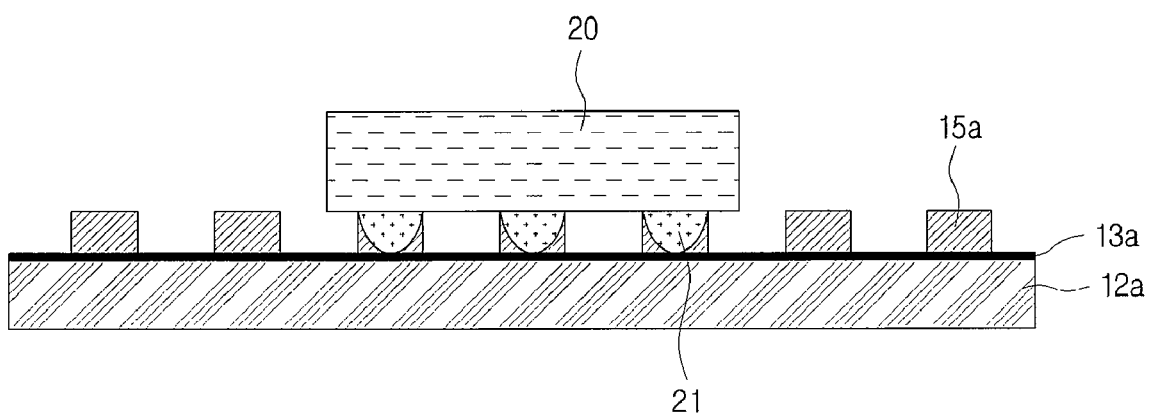
Figure 30:
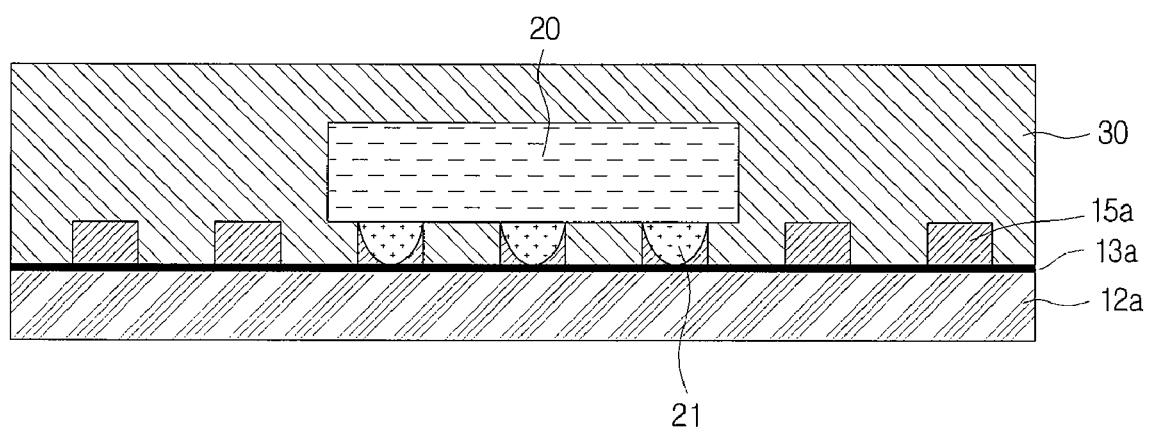
Figure 31:
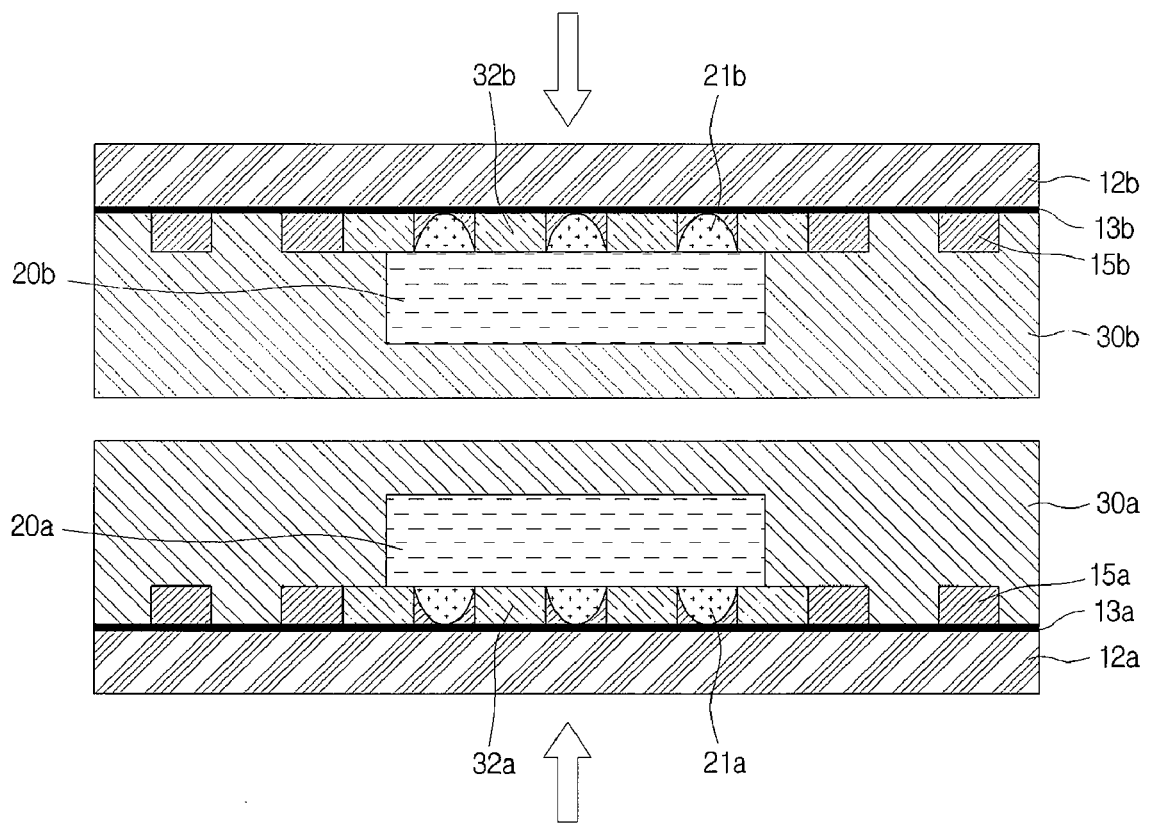

FIG. 27 is a flowchart illustrating a method of manufacturing an electronic component embedded printed circuit board shown in FIG. 26. FIGS. 28 to 34 are flow diagrams illustrating a method of manufacturing an electronic component embedded printed circuit board shown in FIG. 27. Illustrated in FIGS. 28 to 34 are a first carrier 12a, a second carrier 12b, a first seed layer 13a, a second seed layer 13b, circuit patterns 15a, 15b, 15c and 15d, a via 16, a first electronic component 20a, a second electronic component 20b, solder bumps 21a and 21b, insulators 30 and 36, an underfill part 32 and a solder resist 34. First of all, a first carrier 12a having a first circuit pattern 15a formed on one surface thereof is prepared (S210). A first electronic component 20a can be flip-chip bonded to the first circuit pattern 15a (S220), and a first insulator 30a can be stacked on one side of the first carrier 12a to cover the first electronic component 20a (S230). It is appreciated that an underfill part can be formed before stacking the first insulator 30a. Illustrated in FIG. 31 is the underfill part 32a formed at the bottom of the first electronic component.

Likewise, a second carrier 12b having a second circuit pattern 15b formed on one surface thereof is prepared (S240). A second electronic component 20b can be flip-chip bonded to the second circuit pattern 15b (S250), and a second insulator 30b can be stacked on one side of the second carrier 12b to cover the second electronic component 20b (S260). It is apparent that an underfill part 32b can be formed before stacking the second insulator 30b, which can be done in the same process as the first insulator 30a.

A method of preparing the first carrier having the first circuit pattern formed on one surface thereof and the second carrier having the second circuit pattern formed on one surface thereof can be the same as the one described above. The method includes: providing the first carrier 12a and the second carrier 12b coupled together with an adhesive layer, which is illustrated in FIG. 13 (S201); forming the first circuit pattern 15a on the first carrier 12a and the second circuit pattern 15b on the second carrier 12b through electroplating, which is illustrated in FIG. 14 (S202); and separating the first carrier 12a and the second carrier 12b (S203).

Figure 32:
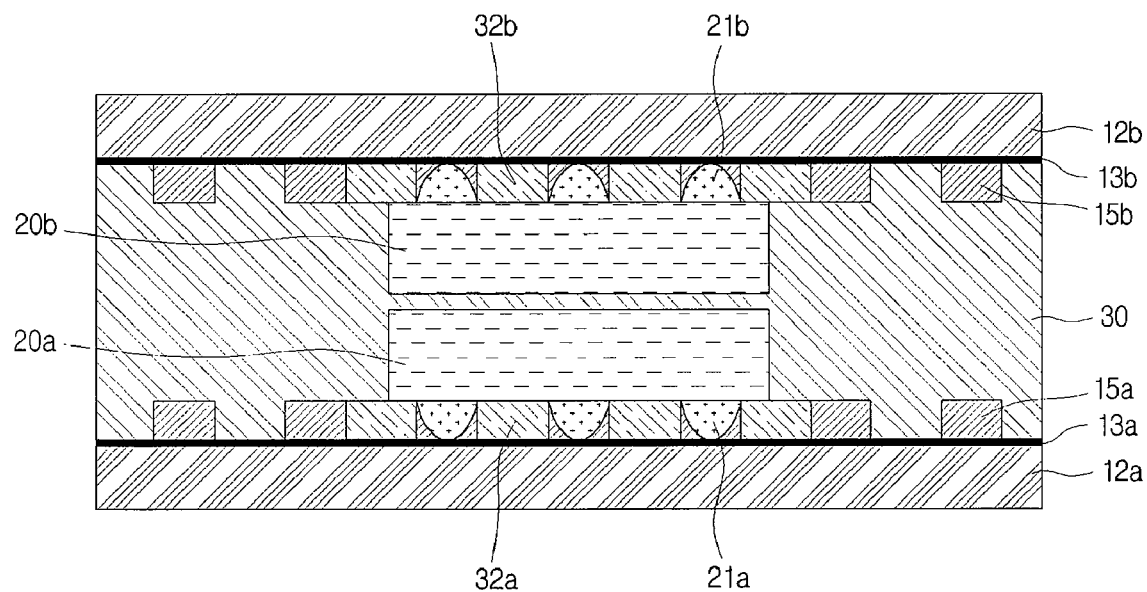

After that, as illustrated in FIGS. 31 and 32, the first insulator 30a and the second insulator 30b can be compressed against each other such that the first electronic component 20a and the second electronic component 20b face each other (S270). When compressing the first insulator 30a and the second insulator 30b by using heat and pressure, the first insulator 30a and the second insulator 30b can become one insulator 30 (FIG. 32), and thus the first electronic component 20a and the second electronic component 20b can be embedded in the insulator 30.

Furthermore, the first electronic component 20a can be flip-chip bonded with the first circuit pattern 15a, and the second electronic component 20b can be flip-chip bonded with the second circuit pattern 15b.

Figure 33:
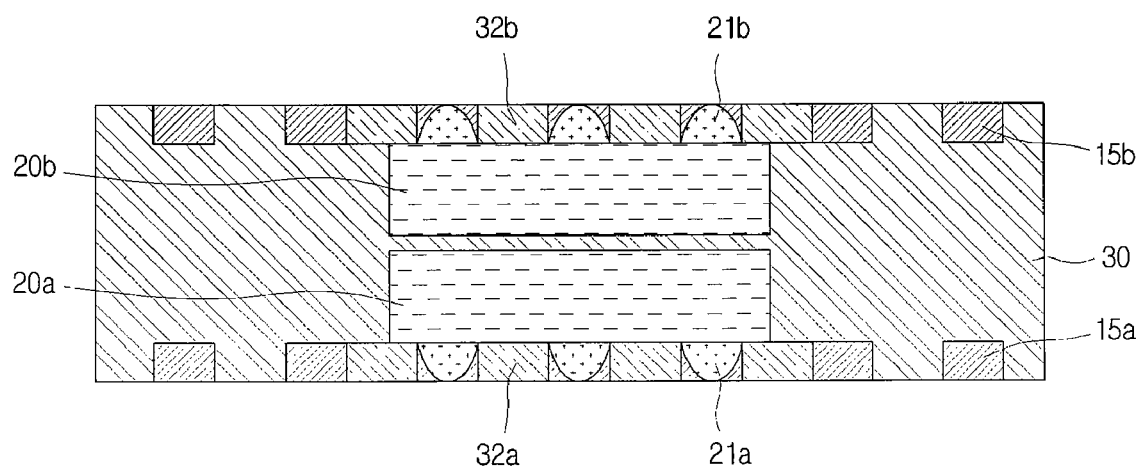
Figure 34:
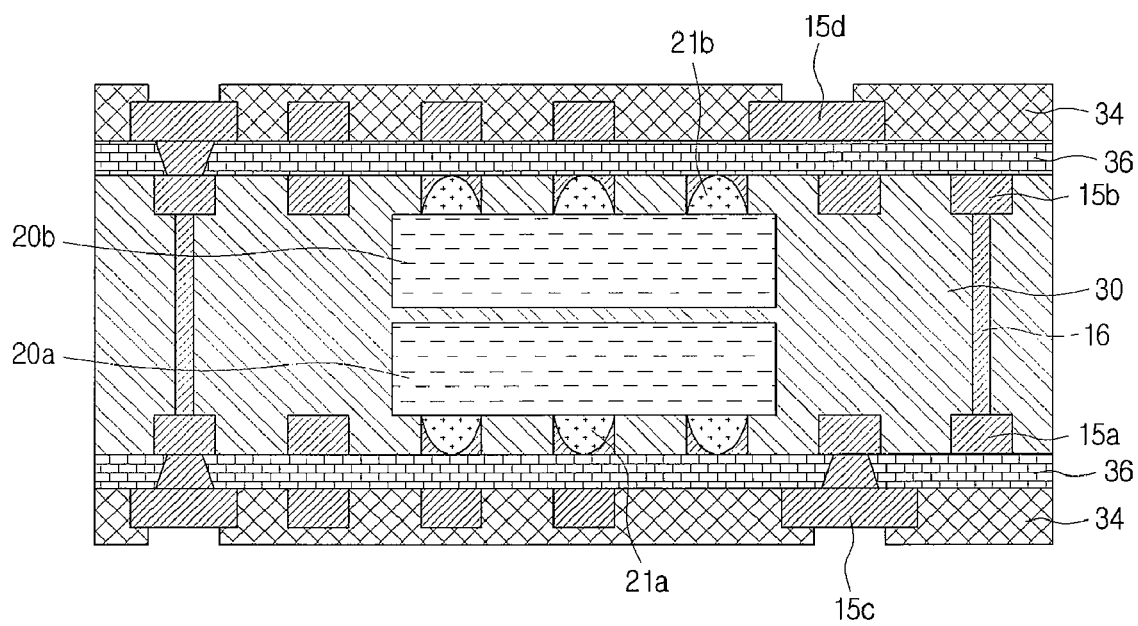

As illustrated in FIG. 33, the first carrier 12a and the second carrier 12b can be removed (S280). As illustrated in FIG. 34, an insulation layer 36 can be stacked on both sides of the insulator 30, and a circuit pattern can be formed on each insulation layer 36, so that an electronic component embedded circuit board having a 4 layered structure can be manufactured.

On the other hand, when manufacturing a two layered electronic component embedded circuit board, a solder resist can be formed on a surface of the insulator 30 having the first circuit pattern 15a and the second circuit pattern 15b embedded therein, without stacking the insulation layer 36.

In order to remove the carriers 12a and 12b, the method of chemical etching can be used. As described above, when the seed layers 13a and 13b, which are made of a different material from that of the carriers 12a and 12b, are formed on surfaces of the carriers 12a and 12b, the circuit patterns 15a and 15b can be protected by dividing the etching process.

Below, a second disclosed embodiment of an electronic component embedded printed circuit board will be described in accordance with another aspect of the present invention.

Figure 35:
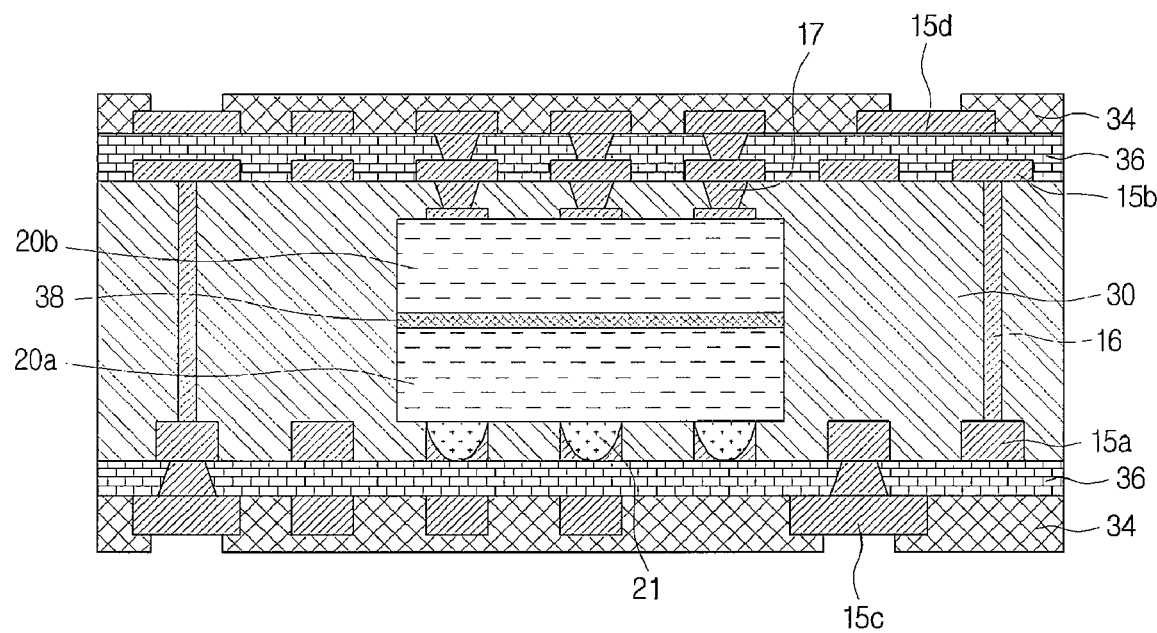
FIG. 35 is a cross sectional view illustrating a second embodiment of an electronic component embedded printed circuit board in accordance with another aspect of the present invention.

FIG. 35 is a cross sectional view illustrating a second embodiment of an electronic component embedded printed circuit board in accordance with another aspect of the present invention. Illustrated in FIG. 35 are circuit patterns 15a, 15b, 15c and 15d, a via 16 and 17, electronic components 20a and 20b, a solder bump 21, insulators 30 and 36 and a solder resist 34.

In this embodiment, an electronic component embedded printed circuit board can have two electronic components 20a and 20b embedded in one insulator 30, in which one of the electronic components can be flip-chip bonded with a circuit pattern 15a and the other one can be connected through a via 17. In addition, the electronic components 20a and 20b can be adhered by using an adhesive part 38.

In comparison with the previously described embodiment, in which the two electronic components 20a and 20b embedded in the insulator 30 are all flip-chip bonded with the circuit patterns 15a and 15b, the present embodiment presents that only one 20a of the two electronic components 20a and 20b is flip-chip bonded and the other one 20b is connected with the circuit pattern through the via 17.

Through such a structure, an electronic component embedded printed circuit board having higher density than that of the related art can be implemented.

Except the difference described above, the present embodiment has the structure of an electronic component embedded circuit board described above, so that redundant explanations are omitted.

Below, a method of manufacturing an electronic component embedded printed circuit board having the structure will be described.

Figure 36:
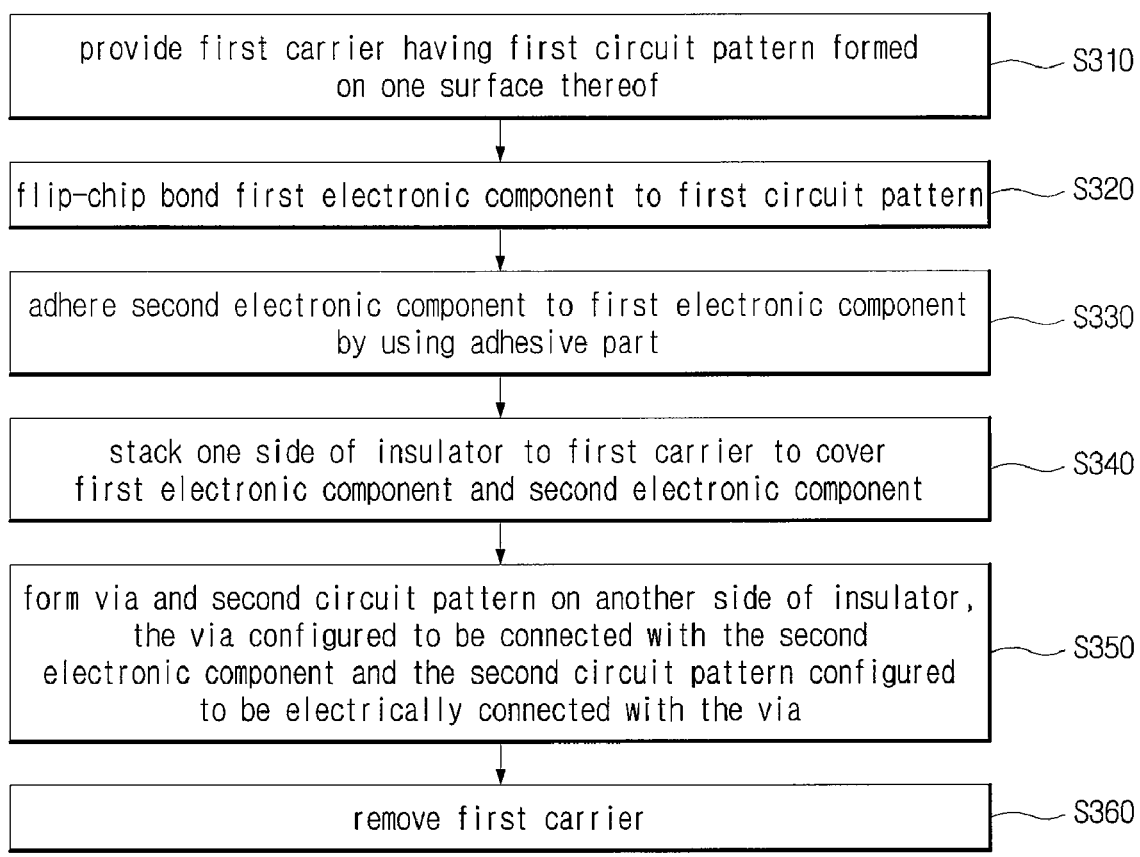
FIG. 36 is a flowchart illustrating a second disclosed embodiment of an electronic component embedded printed circuit board in accordance with another aspect of the present invention.
Figure 37:
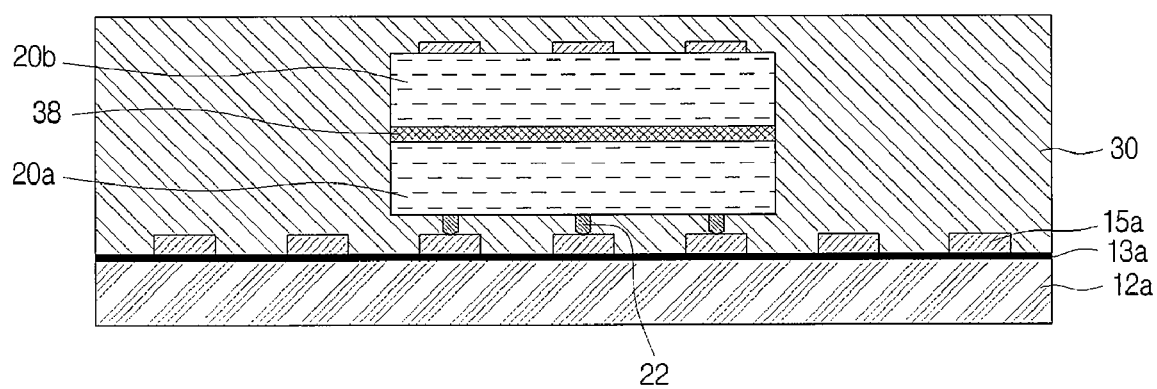
FIGS. 37 to 39 are flow diagrams illustrating a method of manufacturing an electronic component embedded printed circuit board illustrated in FIG. 36.
Figure 38:
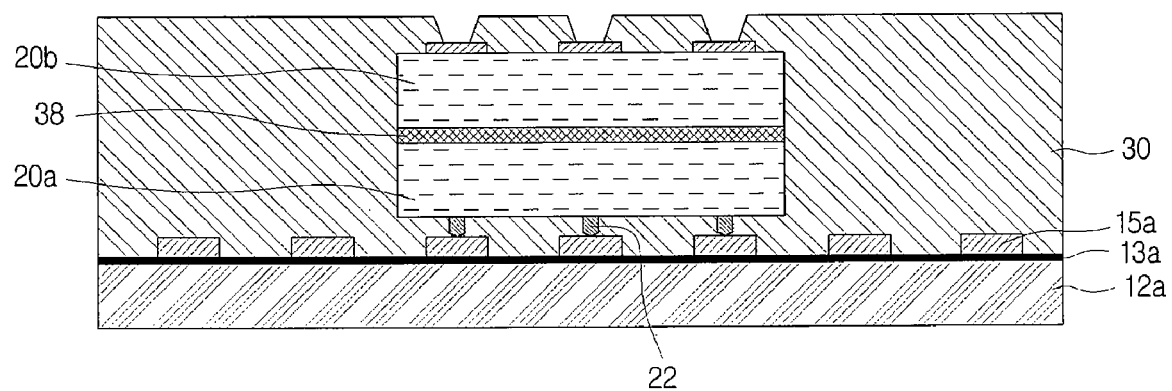
Figure 39:
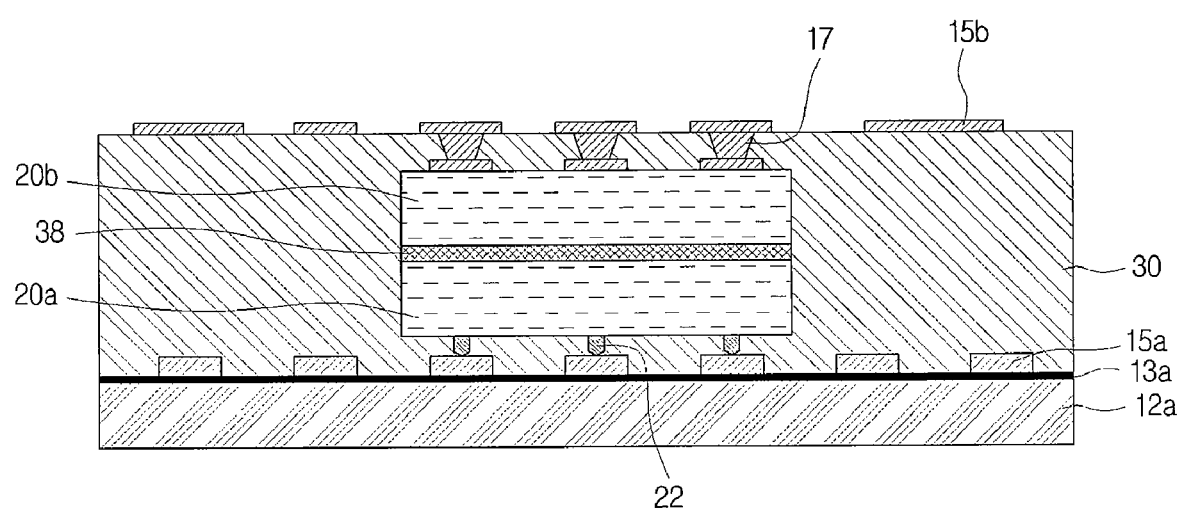

FIG. 36 is a flowchart illustrating a second disclosed embodiment of an electronic component embedded printed circuit board in accordance with another aspect of the present invention. FIGS. 37 to 39 are flowcharts illustrating a method of manufacturing an electronic component embedded printed circuit board illustrated in FIG. 36. Illustrated in FIGS. 37 to 39 are circuit patterns 15a, 15b, 15c and 15d, a via 16 and 17, electronic components 20a and 20b, a solder bump 21, insulators 30 and 36, and a solder resist 34. First of all, a first carrier 12a having a first circuit pattern 15a formed on one surface thereof is prepared (S310), and a first electronic component 20a can be flip-chip bonded to the first circuit pattern 15a (S320).

Likewise, a second electronic component 20b can be adhered to the first electronic component 20a by using an adhesive part 38 (S330). Here, an epoxy type adhesive or a film type adhesive can be used as the adhesive part 38.

After adhering the second electronic component 20b to the first electronic component 20a, one side of an insulator 30 can be stacked on the first carrier 12a to cover the first electronic component 20a and the second electronic component 20b (S340). As illustrated in FIG. 37, the first electronic component 20a and the second electronic component 20b are covered in the insulator 30 through such a process.

Then, a via 17 and a second circuit pattern 15b can be formed on another side of the insulator 30, in which the via is connected with the second electronic component and the second circuit pattern is electrically connected with the via (S350). For forming the via 17, as illustrated in FIG. 38, a via hole can be formed in the insulator by using a layer drill, and then a conductive material can be filled inside the via hole by way of electroless plating and electroplating. As such, the second circuit pattern 15b can be simultaneously formed on the insulator through the via forming process by using electroless plating or electroplating.

Then, the first carrier 12a can be removed (S360), and thus an electronic component embedded printed circuit board can be manufactured by forming a solder resist at an outermost layer.

As illustrated in FIG. 35, when implementing a multi-layered structure, an additional insulator 36 can be respectively stacked on each side of the insulator 30, and then each of circuit patterns 15c and 15d can be formed on each insulator 36.

According to certain embodiments of the invention as set forth above, the degree of conformation for an electrical component can be improved by embedding the electrical component using a flip-chip bonding method, and the yield can improved by simplifying the production process.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. A method of manufacturing an electronic component embedded printed circuit board, the method comprising:
 providing a first carrier having a first circuit pattern formed on one surface thereof;
 providing a second carrier having a second circuit pattern formed on one surface thereof;
 flip-chip bonding an electronic component to the first circuit pattern;
 stacking one side of an insulator on one side of the first carrier to cover the electronic component;
 compressing the second carrier having the second circuit pattern formed on one surface thereof on an other side of the insulator; and
 removing the first carrier and the second carrier,
 wherein the providing of the first carrier having the first circuit pattern formed on one surface thereof and the providing of the second carrier having the second circuit pattern formed on one surface thereof are performed simultaneously through:
 providing the first carrier and the second carrier coupled together with an adhesive layer formed by a material, which has a flexible adhesive strength being changed by temperature;
 forming the first circuit pattern on the first carrier and the second circuit pattern on the second carrier through electroplating; and
 separating the first carrier and the second carrier.

2. The method of claim 1, wherein the electronic component is flip-chip bonded with the first circuit pattern using a solder bump or a gold stud bump.

3. The method of claim 1, wherein:
- a first seed layer is formed on one side of the first carrier, the first seed layer being made of a different material from that of the first carrier; and
- the removing of the first carrier comprises removing the first seed layer.

4. A method of manufacturing an electronic component embedded printed circuit board, the method comprising:
- providing a first carrier having a first circuit pattern formed on one surface thereof;
- flip-chip bonding a first electronic component to the first circuit pattern;
- stacking a first insulator on one side of the first carrier to cover the first electronic component;
- providing a second carrier having a second circuit pattern formed on one surface thereof;
- flip-chip bonding a second electronic component to the second circuit pattern;
- stacking a second insulator on one side of the second carrier to cover the second electronic component;
- compressing the first insulator and the second insulator such that the first electronic component and the second electronic component face each other; and
- removing the first carrier and the second carrier,
- wherein the providing of the first carrier having the first circuit pattern formed on one surface thereof and the providing of the second carrier having the second circuit pattern for on one surface thereof are performed simultaneously through:
  - providing and the second carrier coupled together with an adhesive layer formed by a material, which has a flexible adhesive strength being changed by temperature;
  - forming the first circuit pattern on the first carrier and the second circuit pattern on the second carrier through electroplating; and
  - separating a first carrier and the second carrier.

5. The method of claim 4, wherein the first electronic component is flip-chip bonded with the first circuit pattern by using a solder bump or a gold stud bump.

6. The method of claim 4, wherein:
- a first seed layer is formed on one side of the first carrier, the first seed layer being made of a different material from that of the first carrier; and
- the removing of the first carrier comprises removing the first seed layer.

* * * * *